(12) United States Patent
Wu et al.

(10) Patent No.: US 10,438,044 B2
(45) Date of Patent: Oct. 8, 2019

(54) SURFACE TEXTURE IDENTIFICATION DISPLAY DEVICE

(71) Applicant: BOE TECHNOLOGY GROUP CO., LTD., Beijing (CN)

(72) Inventors: Chun Wei Wu, Beijing (CN); Xue Dong, Beijing (CN); Haisheng Wang, Beijing (CN); Yingming Liu, Beijing (CN); Xiaoliang Ding, Beijing (CN); Jing Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/750,302

(22) PCT Filed: Jul. 21, 2017

(86) PCT No.: PCT/CN2017/093823
§ 371 (c)(1),
(2) Date: Feb. 5, 2018

(87) PCT Pub. No.: WO2018/024117
PCT Pub. Date: Feb. 8, 2018

(65) Prior Publication Data
US 2019/0026530 A1 Jan. 24, 2019

(30) Foreign Application Priority Data

Aug. 4, 2016 (CN) .......................... 2016 1 0633369

(51) Int. Cl.
*G06F 3/038* (2013.01)
*G09G 5/00* (2006.01)
(Continued)

(52) U.S. Cl.
CPC .......... *G06K 9/00046* (2013.01); *G06K 9/00* (2013.01); *H01L 27/146* (2013.01); *H01L 27/14678* (2013.01)

(58) Field of Classification Search
None
See application file for complete search history.

(56) References Cited

U.S. PATENT DOCUMENTS

2003/0183019 A1   10/2003 Chae
2009/0232362 A1*  9/2009 Otsubo .............. G06K 9/00026
                                                         382/115
(Continued)

FOREIGN PATENT DOCUMENTS

CN   102842027 A   12/2012
CN   104182727 A   12/2014
(Continued)

OTHER PUBLICATIONS

International Search Report dated Oct. 26, 2017.
First Chinese Office Action dated Dec. 18, 2017.

*Primary Examiner* — Lunyi Lao
*Assistant Examiner* — Kirk W Hermann
(74) *Attorney, Agent, or Firm* — Dilworth & Barrese, LLP.; Michael J. Musella, Esq.

(57) ABSTRACT

A surface texture identification display device including a base substrate (10) and a contact plate overlapped with each other, the contact plate having a first surface configured to contact a textured surface, the first surface being located on a side of the contact plate facing away from the base substrate; and a plurality of pixel units located between the base substrate and the contact plate, wherein at least one of the pixel units includes a light sensing component on the base substrate, a light converging component located between light sensing component and the contact plate; a light shielding component located between light converging component and the light sensing component; wherein the light shielding component has a light transmission hole so that light passing through the contact plate and the light converging component passes through the light transmission hole to arrive at the light sensing component.

18 Claims, 7 Drawing Sheets

(51) Int. Cl.
 *G06K 9/00* (2006.01)
 *H01L 27/146* (2006.01)

(56) References Cited

U.S. PATENT DOCUMENTS

| | | | |
|---|---|---|---|
| 2012/0242884 | A1 | 9/2012 | Ishiguro et al. |
| 2012/0256089 | A1* | 10/2012 | Kanda ................. G06K 9/0004 250/338.1 |
| 2014/0355846 | A1 | 12/2014 | Lee et al. |
| 2015/0187980 | A1* | 7/2015 | Yamamoto ............... G06F 1/00 250/552 |
| 2015/0369661 | A1* | 12/2015 | Lin ...................... G06K 9/0004 250/227.11 |
| 2016/0253956 | A1* | 9/2016 | Sagawa ................ G09G 3/3233 345/76 |
| 2017/0193270 | A1* | 7/2017 | Zhang ................... G02B 6/005 |
| 2018/0060641 | A1* | 3/2018 | Kim ................... G06K 9/00013 |

FOREIGN PATENT DOCUMENTS

| | | |
|---|---|---|
| CN | 105205469 A | 12/2015 |
| CN | 105304656 A | 2/2016 |
| CN | 105550664 A | 5/2016 |
| CN | 106022324 A | 10/2016 |
| CN | 106233305 A | 12/2016 |
| CN | 206058224 U | 3/2017 |

* cited by examiner

SURFACE TEXTURE IDENTIFICATION DISPLAY DEVICE

TECHNICAL FIELD

The embodiments of the present disclosure relate to a surface texture identification display device.

BACKGROUND

With the rapid development of display technology, touch screen panels have gradually become popular in people's lives. At present, the touch screens according to the working principle can be divided into following types: resistive type, capacitive type, infrared type, surface acoustic wave type, electromagnetic type, vibration sensing type and frustrated total internal reflection optical sensing type.

SUMMARY

An embodiment of the present disclosure provides a surface texture identification display device including: a base substrate and a contact plate overlapped with each other, the contact plate having a first surface configured to contact a textured surface, the first surface being located on a side of the contact plate facing away from the base substrate; and a plurality of pixel units located between the base substrate and the contact plate, wherein at least one of the pixel units includes: a light sensing component on the base substrate; a light converging component located between the light sensing component and the contact plate; and a light shielding component located between the light converging component and the light sensing component, wherein the light shielding component has a light transmission hole so that light passing through the contact plate and the light converging component passes through the light transmission hole to arrive at the light sensing component.

In an example, a main optical axis of the light converging component is substantially perpendicular to the contact plate.

In an example, the light converging component is a convex lens.

In an example, a shape of an orthographic projection of the light transmission hole on the contact plate is substantially the same as a shape of an orthographic projection of the light converging component on the contact plate.

In an example, a center of the light transmission hole is located on a main optical axis of the light converging component.

In an example, wherein a main optical axis of the light converging component is located in a cross section, a center of the light transmission hole and a focal point of the light converging component are located in the cross section and do not coincide with each other, a width d of the light transmission hole in the cross section satisfies: $d \geq sl/f$; wherein, s refers to a distance between a center of the light transmission hole and a focal point of the light converging component, l refers to a maximum width of the light converging component in the cross section, and f refers to a focal length of the light converging component.

In an example, a center of the light transmission hole coincides with a focal point of the light converging component.

In an example, the at least one pixel unit further includes: a first switching element, a source electrode of the first switching element is connected with the light sensing component, a gate electrode of the first switching element is connected with a scanning line, and a drain electrode of the first switching transistor is connected with a signal line.

In an example, the at least one pixel unit further includes: a second switching element and a light-emitting component; wherein the light-emitting component includes a first electrode layer, a second electrode layer and a light-emitting layer therebetween, the first electrode layer is connected with the second switching element.

In an example, the light sensing component is a photodiode having a first electrode and a second electrode, the first electrode is connected with the source electrode of the first switching element, the second electrode is connected with a reference signal line.

In an example, the light-emitting component is located on a side of the second switching element facing the contact plate; the light sensing component is located between the second switching transistor and the second electrode of the light-emitting component.

In an example, the light converging component is located between the second electrode layer and the contact plate.

In an example, in a direction perpendicular to the base substrate, the second electrode is overlapped with the light converging component and the light shielding component.

In an example, the light shielding component is located between the first electrode layer and the second electrode layer.

In an example, the shielding component and the first electrode layer are located in a same layer.

In an example, an orthographic projection of the light shielding component on the base substrate is not overlapped with an orthographic projection of the first electrode layer on the base substrate.

In an example, the second electrode layer is configured to transmit light emitted by the light-emitting layer.

In an example, a source electrode of the first switching element and a source electrode of a second switching element are located in a same layer, a drain electrode of the first switching element and a drain electrode of the second switching element are located in a same layer; a gate electrode of the first switching element and a gate electrode of the second switching element are located in a same layer; and an active layer of the first switching element and an active layer of the second switching element are located in a same layer.

In an example, the light shielding component is conductive, and the second electrode of the light sensing component is connected with the reference signal line through the light shielding component.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The shapes and sizes of the components in the figures do not represent real proportions for the purpose of merely illustrating the present disclosure.

Figure 1:
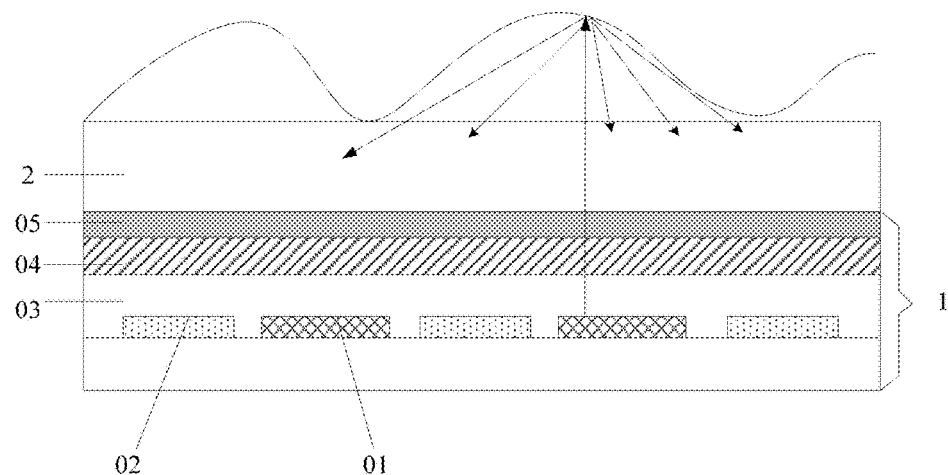
FIG. 1 illustrates a schematic structure diagram of a fingerprint identification display device.

In a security-based personal authentication system of a touch screen, the use of fingerprints for identification has been widely used. FIG. 1 illustrates a fingerprint identification display device mainly including a display panel 1 and a protection cover plate 2 located on the display panel 1. The display panel 1 has pixel regions arranged in a matrix, each of the pixel regions is provided with an organic electroluminescent pixel unit 01 and a light sensing unit 02. However, in the above-mentioned fingerprint identification display device, as illustrated in FIG. 1, because at least an encapsulation film 03, a polarizer layer 04, a transparent optical adhesive layer 05 and the protective cover 2 of the display panel 1 are provided between the light sensing unit 02 and the finger, a distance between the finger and the light sensing unit 02 is large; when a finger presses the protection cover plate 2, the light emitted from the organic electroluminescent pixel unit 01 passes through these film layers to irradiate to the finger and then is diffusely reflected with large divergence angles, causing light at the same position of the fingerprint to be irradiated onto a plurality of light sensing units 02 after re-passing through these layers, so that optical crosstalk occurs. Moreover, a thickness of the protective cover 2 in the fingerprint identification display device is relatively large, so the problem of optical crosstalk is serious, which seriously affects the fingerprint identification capability of the fingerprint identification display device.

Figure 2:
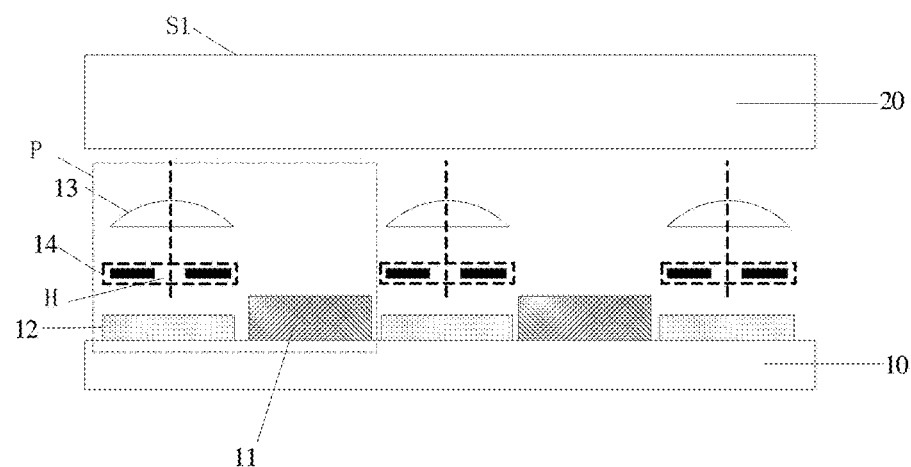
FIG. 2 is a schematic structural diagram of a surface texture identification display device according to an embodiment of the present disclosure.

The embodiment of the present disclosure provides a surface texture identification display device. Herein, the surface texture identification display device is a display device having a surface texture identification function. For example, surface texture refers to a fingerprint and a palm print of a human. As illustrated in FIG. 2, the surface texture identification display device includes a base substrate 10 and a contact plate 20 opposite to each other. A plurality of pixel units P is formed on the base substrate 10. A light sensing unit (i.e., a light sensing component) 12 is disposed in at least a part of the pixel units P. The contact plate 20 is located on a side of the light sensing unit 12 facing away from the base substrate 10. For example, each of the pixel units P includes:

a light converging lens (i.e., a light converging component) 13 corresponding to the light sensing unit 12 and located on a side of the respective light sensing units 12 facing the contact plate 20; the light converging lenses 13 is configured to converge the light incident from a side of the light converging lens 13 facing the contact plate 20 toward a main optical axis of the light converging lens 13 after the light passing through the light converging lens 13. For example, before the light is incident on the light converging lens 13, for example, the light is reflected by a textured surface (e.g., a surface of a human finger) which is in contact with a first surface S1 of the contact plate 20, passes through the contact plate 20, and then arrives at the light converging lens 13.

a light shielding part (i.e., light shielding component) 14 corresponding to the light converging lens 13 and located between the light converging lens 13 and the corresponding light sensing unit 12. Each of the light shielding parts 14 has one light transmission hole, and the light converged to a main optical axis direction of the light converging lens 13 at least partially passes through the light transmission hole and irradiates on the corresponding light sensing unit 12.

The above-mentioned surface texture identification display device provided by the embodiment of the present disclosure includes a base substrate and a contact plate opposite to each other, light sensing units located on the base substrate, light converging lenses in a one-to-one correspondence with the light sensing units and located on a side of the respective light sensing units facing the contact plate, and light shielding parts in a one-to-one correspondence with the light converging lenses and located between the light converging lens and the corresponding light sensing unit. Because the light transmission hole and the light converging lens are disposed between each light sensing unit and the contact plate, when a finger or a palm touches the contact plate, light reflected by the finger or the palm and irradiated on the light converging lens is converged by the light converging lens toward the main optical axis of the light converging lens. Moreover, due to the light transmission hole is provided, only a part of the light satisfying a specific condition can be irradiated on the light sensing unit, so that each light sensing unit only collects light with a specific transmission direction, thereby reducing optical crosstalk even if a distance between the light sensing unit and the contact plate is large. Moreover, the light converging lens can increase light intensity, so as to improve touch sensitivity.

It should be noted that the surface texture identification display device provided by the embodiments of the present disclosure can be applied not only to fingerprint collecting, palm print collecting, or simultaneous fingerprint and palm print collecting, but also to other textures collecting, which is not limited herein. For facilitating illustration, the embodiments of the present disclosure are described by taking the textured surface as a fingerprint or a palm print as an example.

It should be further noted that, in the surface texture identification display device provided by the embodiments of the present disclosure, the contact plate is mainly configured to be in contact with a textured surface. For example, the contact plate can be a transparent substrate, which is not limited herein. Herein, the transparent substrate means, for example, a substrate that is transparent to the light emitted from the light-emitting component 11. For example, in the surface texture identification display device provided by the embodiments of the present disclosure, in order to improve the identification accuracy, each of the pixel regions is provided with a light sensing unit.

Further, in the surface texture identification display device provided in the embodiments of the present disclosure, the pixel units P are arranged in a matrix, which is not limited herein.

Figure 3:
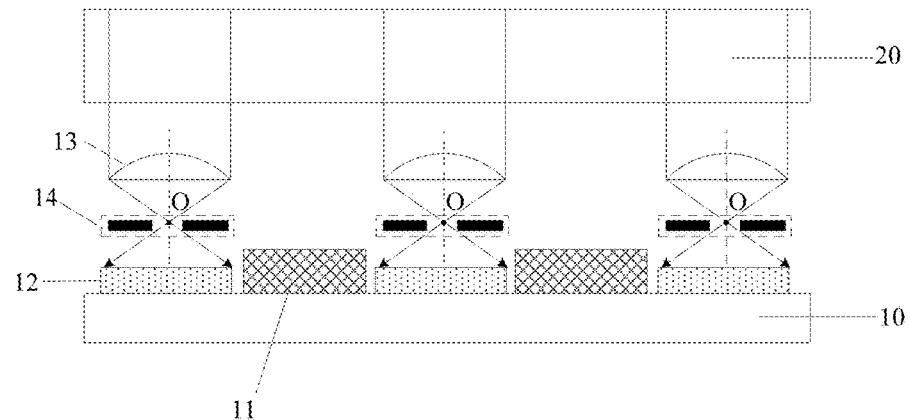
FIG. 3 is a schematic diagram of a part of optical paths of a surface texture identification display device provided by an embodiment of the present disclosure when a finger touches thereon.

For example, in the surface texture identification display device provided in the embodiments of the present disclosure, as illustrated in FIG. 3, the light converging lens 04 is a convex lens. Because the incident light parallel to the main optical axis can be converged by the convex lens onto the same point of the main optical axis, that is, the focal point O of the convex lens, only the incident light parallel to the main optical axis can be collected by using the light transmission hole as illustrated in FIG. 3. In this way, each of the light sensing units 12 collects only the incident light in the area covered by the corresponding light converging lens 13 and in parallel to the main optical axis, and the light satisfying these conditions can only be light reflected by the fingerprint or the palm print and located in the area covered by the light converging lens 13. Therefore, optical crosstalk does not occur no matter how far the light sensing unit 12 is from an upper surface of the contact plate 01.

For example, in the surface texture identification display device provided in the embodiments of the present disclosure, an orthographic projection of the light transmission hole H on the base substrate 10 is substantially the same as that of the convex lens 13 on the base substrate 10. A center (e.g., geometric center) of the light transmission hole is located on the main optical axis of the convex lens.

For example, the orthographic projection of the light transmission hole on the contact plate has a shape of a circle or a square, and the orthographic projection of the convex lens on the contact plate also has a shape of a circle or a square correspondingly. However, the areas of the two circles or the two squares can be equal or may be not equal. For example, in the above-mentioned surface texture identification display device provided by the embodiment of the present disclosure, as illustrated in FIGS. 4a to 4c, a width d of the light transmission hole in any cross section along the main optical axis of the convex lens satisfies:

$$d \geq sl/f;$$

wherein, s refers to a distance between a center of the light transmission hole H and a focal point O of the convex lens, l refers to a maximum width of the light converging component in the cross section, and f refers to a focal length of the convex lens. In this way, all the incident light perpendicular to the convex lens can pass through the light transmission hole.

Figure 4A:
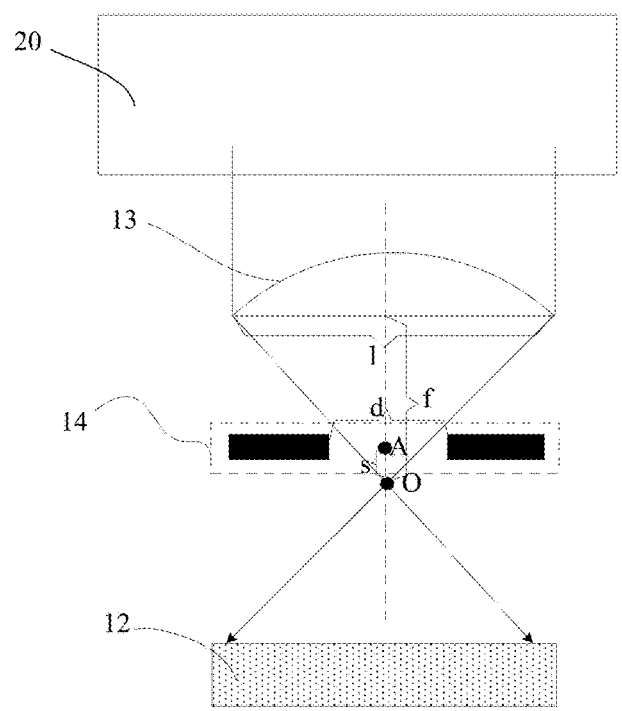
FIG. 4a to FIG. 4c are respectively schematic diagrams of a relative position between a light shielding part and a light converging lens in a surface texture identification display device according to an embodiment of the present disclosure.
Figure 4B:
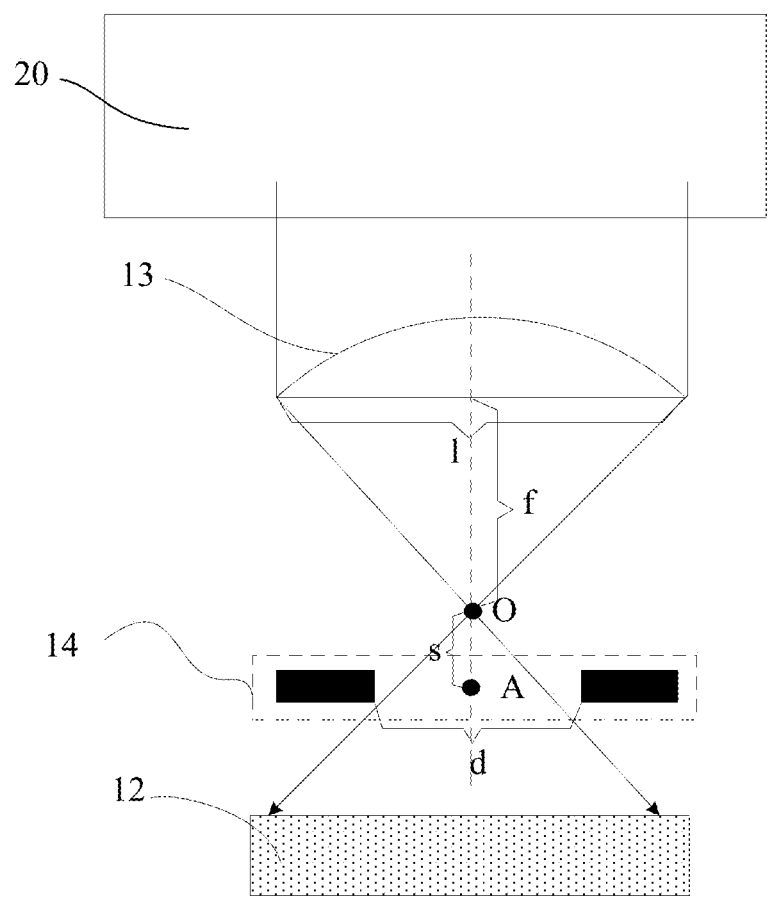
Figure 4C:
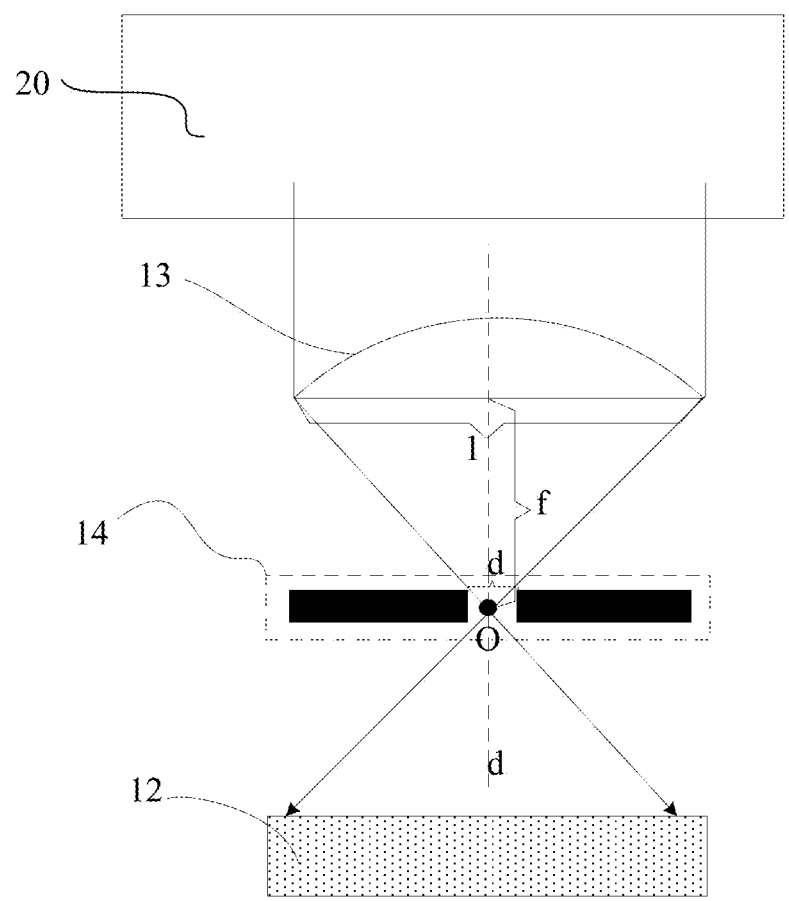

For example, in the above-mentioned surface texture identification display device provided by the embodiments of the present disclosure, as illustrated in FIG. 4a, a distance between the light shielding part 14 and the convex lens can be smaller than the focal length f of the convex lens; or as illustrated in FIG. 4b, the distance between the light shielding part 14 and the convex lens can be greater than the focal length f of the convex lens; or as illustrated in FIG. 4c, the distance between the light shielding part 14 and the convex lens can be equal to the focal length f of the convex lens, i.e., the focal point O of the convex lens coincides with the center A of the light transmission hole, which are not limited herein. The relative position between the light shielding part 14 and the convex lens can be determined according to the practical situation. However, it can be seen from the figures that the farther the light shielding part 14 is from the focal point O of the convex lens, the larger the diameter of the light transmission hole on the light shielding part 12 is.

For example, in the surface texture identification display device provided by the embodiments of the present disclosure, the center of the light transmission hole is located at the focal point of the convex lens, so that the diameter of the light transmission hole can be minimized so as to avoid, to the greatest extent, light converged onto other points other than the focal point on the main optical axis from irradiating onto the light sensing unit.

It should be noted that in the above surface texture identification display device provided by the embodiments of the present disclosure, the focal point refers to a focal point located on a side of the convex lens facing the light sensing unit.

For example, in the surface texture identification display device provided by the embodiments of the present disclosure, the convex lens can be a biconvex structure (that is, having two opposite protruding curved surfaces), or a plano-convex structure (that is, having one flat surface and one protruding curved surface), which are not limited herein.

For example, in the surface texture identification display device provided in the embodiments of the present disclosure, the convex lens is a plano-convex structure, and a plane of the convex lens faces the light shielding part and a convex surface of the convex lens faces the contact plate. For example, the convex lens can be formed by imprinting.

Figure 5:
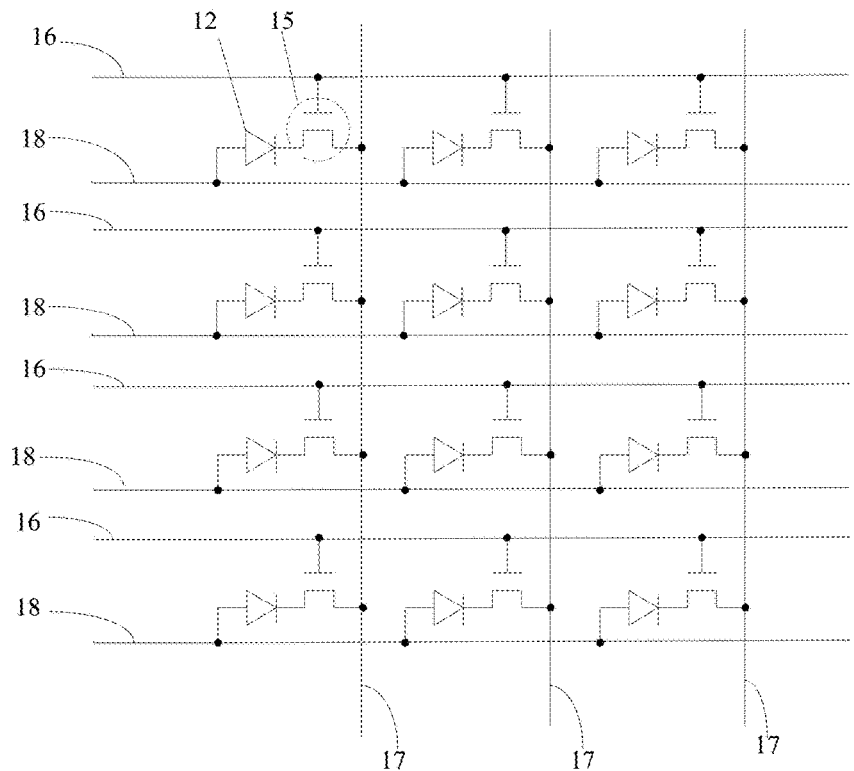
FIG. 5 is a partial circuit diagram of a surface texture identification display device according to an embodiment of the present disclosure.

Further, the surface texture identification display device provided by the embodiment of the present disclosure, as illustrated in FIG. 5, further includes control switching transistors (as an example of a first switching element) 15 connected with the light sensing units 12 in a one-to-one correspondence and located in the pixel regions; a identification scanning line 16 configured to load an identification scanning signal to a corresponding control switching transistor 15, and a identification output line 17 configured to load a negative bias voltage to the light sensing unit 12 or read an output electric signal of the light sensing unit 12 by a corresponding control switching transistor 15.

The respective identification scanning lines 16 corresponds to the respective rows of light sensing units 12 in a one-to-one correspondence, and the respective identification output lines 17 correspond to the columns of light sensing units 12 in one-to-one correspondence. Alternatively, the respective identification scanning line 16 corresponds to the respective columns of light sensing units 12 in one-to-one correspondence, and the respective identification output line 17 corresponds to the respective rows of the light sensing units 12 in one-to-one correspondence.

Figure 6A:
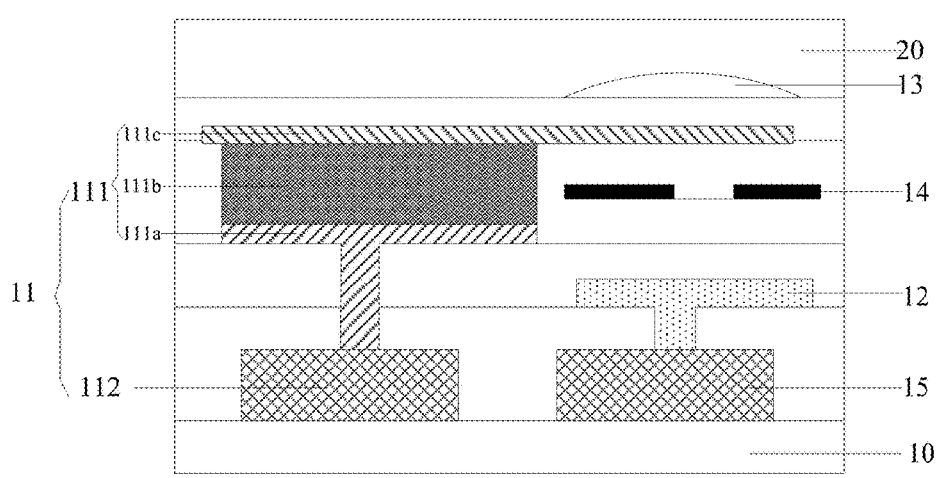
FIG. 6a and FIG. 6b are respectively schematic structural diagrams of surface texture identification display devices provided in embodiments of the present disclosure.
Figure 6B:
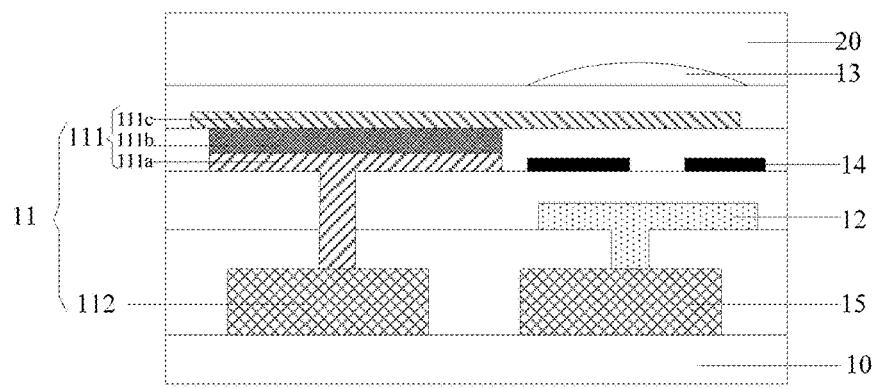

For example, in the surface texture identification display device provided by the embodiment of the present disclosure, as illustrated in FIG. 2, a pixel circuit located in the respective pixel regions and organic electroluminescent structures 111 electrically connected with the pixel circuit are further included, as illustrated in FIG. 6a and FIG. 6b. The pixel circuit includes at least one pixel switching transistor 112 (as an example of the second switching element). The pixel switching transistor 112 has the same structure as the control switching transistor 15, and elements with the same function disposed in the pixel switching transistor 112 and the control switching transistor 15 respectively are provided in the same layer. In this way, the control switching transistor can be formed at the same time as the pixel switching transistor, so that the process of forming the control switching transistor does not need to be separately added.

Further, in the surface texture identification display device provided by the embodiments of the present disclosure, as illustrated in FIG. 6a and FIG. 6b, the light sensing unit 12 is a photodiode;

the organic electroluminescent structure 111 is located on a side of the pixel switching transistor 112 facing the contact plate 20; and The photodiode is located between the control switching transistor 15 and the organic electroluminescent structure 111.

Further, in the surface texture identification display device provided by the embodiment of the present disclosure, as illustrated in FIG. 5, one electrode of the photodiode is connected with the corresponding control switching transistor 15; and The surface texture identification display device further includes a reference signal line 18 connected with the other electrode of each photodiode.

For example, in the surface texture identification display device provided in the embodiments of the present disclosure, the control switching transistor generally includes a gate electrode, an active layer, a source electrode and a drain electrode.

Further, in the above-mentioned surface texture identification display devices provided by the embodiments of the present disclosure, as illustrated in FIG. 6a and FIG. 6b, the organic electroluminescent structure 111 includes a first electrode layer 111a, a light-emitting layer 111b and a second electrode layer 111c; and The light converging lens 13 is located between the second electrode layer 111c and the contact plate 20.

For example, in the surface texture identification display device provided in the embodiments of the present disclosure, the first electrode layer can be a cathode layer and the second electrode layer can be an anode layer. Of course, the first electrode layer can be also an anode layer and the second electrode layer is a cathode layer, which is not limited herein.

For example, the second electrode layer 111c is configured to transmit light emitted from the light-emitting layer. For example, the light converged by the light converging lens 13 can propagate through the second electrode layer 111c.

Further, in the surface texture identification display device provided by the embodiment of the present disclosure, as illustrated in FIG. 6a, the light shielding part 14 is located between the first electrode layer 111a and the second electrode layer 111c, and an orthographic projection of the light shielding part 14 on the base substrate 10 is not overlapped an orthographic projection of the first electrode layer 111a on the base substrate 10.

Alternatively, in the surface texture identification display devices provided by the embodiments of the present disclosure, as illustrated in FIG. 6b, the light shielding part 14 and the first electrode layer 111a are located on the same layer and are independent from each other.

For example, the display device generally includes a display panel, and the display panel includes an array substrate and a counter substrate. Therefore, in the surface texture identification display device provided by the embodiment of the present disclosure, the contact plate can refer to a counter substrate in an existing display panel. Of course, the contact plate can also be a protective cover outside an existing display panel, which is not limited thereto.

For example, in the above surface texture identification display devices provided by the embodiments of the present disclosure, the organic electroluminescent structure 111 can be adopted as an original light source for the light sensing unit 12; that is, when an object with a textured surface touches the contact plate, light generated by the organic electroluminescent structure passes through the contact plate and is irradiated to the object with the textured surface and then reflected by the textured surface, the light reflected by the object with the textured surface sequentially passes through the contact plate and the light converging component and then is converged toward a main optical axis of the light converging component; and the light converged toward the main optical axis of the light converging component at least partially passes through the light transmission hole and is irradiated to the light sensing component.

In the surface texture identification display device provided in the embodiments of the present disclosure, the light shielding component and the light converging lens are disposed above each light sensing unit. In addition, other film layers in the surface texture identification display device can be further provided, which is not described in detail herein.

The positions of the light shielding component and the light converging lens in the above-mentioned surface texture identification display devices provided by the embodiments of the present disclosure are described in detail below with reference to the embodiments. However, the present disclosure is not limited thereto and is merely intended for illustration.

Figure 7A:
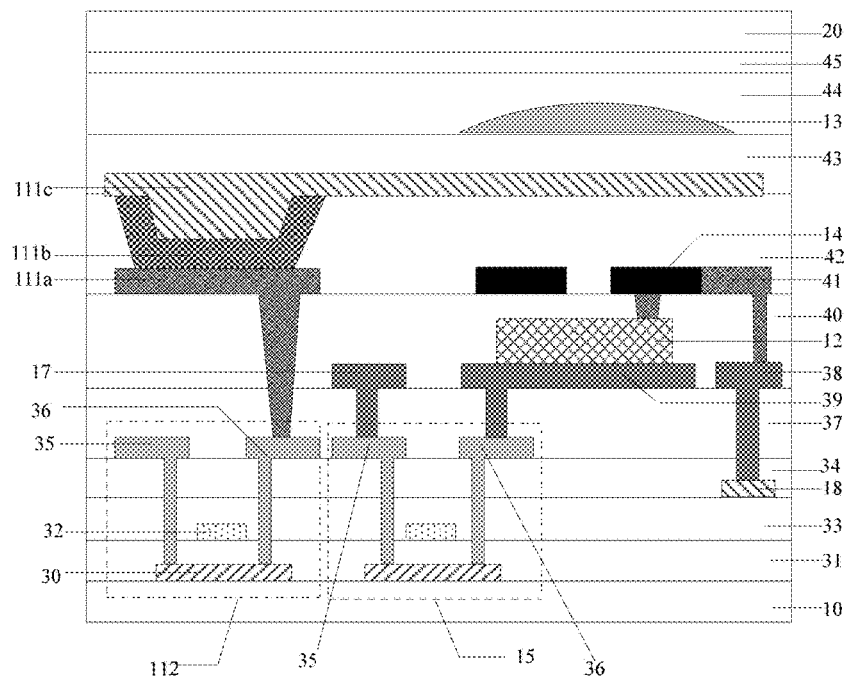
FIG. 7a and FIG. 7b are respectively schematic structural diagrams of a surface texture identification display devices provided in embodiments of the present disclosure.

As illustrated in FIG. 7a, the surface texture identification display device provided by the embodiment of the present disclosure includes a base substrate 10; above the base substrate sequentially disposed are: a gate electrode 30; a gate electrode insulation layer 31; an active layer 32; a first dielectric layer 33; a reference signal line 18; a second dielectric layer 34; a source electrode 35 and a drain electrode 36 provided in the same layer; a first insulation layer 37; a identification output line 17, a first connection portion 38, and a second connection portion 39 which are disposed in a same layer; a light sensing unit 12; a second insulation layer 40; a first electrode layer 111a, a third connection portion 41 and a light shielding component 14 which are disposed in a same layer; a pixel defining layer 42; a light-emitting layer 111b; a second electrode layer 111c; an encapsulation film 43; a light converging lens 13; a polarizing layer 44; an optical clear adhesive layer 45 and a contact plate 20 (i.e., a protective cover).

The first electrode layer 111a is an anode layer, the second electrode layer 111c is a cathode layer; the first electrode layer 111a is connected with the drain electrode 36 of the pixel switching transistor 112, and the identification output line 17 is connected with the source electrode 35 of the control switching transistor 15. One end of the light sensing unit 12 is connected with the drain electrode 36 of the control switching transistor 15 via the second connection portion 39. The other end of the light sensing unit 12 is connected with the reference signal line 18 through the third connection portion 41 and the first connection portion 38.

For example, the light sensing unit is a photodiode, and the photodiode generally includes a P electrode, a semiconductor layer, and an N electrode.

For example, a transparent conductive layer is further disposed between the photodiode and the third connection portion, which is not limited herein.

Taking the surface texture identification display device illustrated in FIG. 7a as an example, the method for fabricating the surface texture identification display device includes the following steps: (1) forming a gate electrode 30;

(2) forming a gate electrode insulation layer 31; (3) forming an active layer 32; (4) forming a first dielectric layer 33; (5) forming a reference signal line 18; (6) forming a second dielectric layer 34; (7) forming a source electrode 35 and a drain electrode 36; (8) forming a first insulation layer 37; (9) forming a identification output line 17, a first connection portion 38 and a second connection portion 39; (10) forming a light sensing unit 12; (11) forming a second insulation layer 40; (12) forming a light shielding part 14; (13) forming a first electrode layer 111a and a third connection portion 41; (14) forming a pixel defining layer 42; (15) forming a light-emitting layer 111b; (16) forming a second electrode layer 111c; (17) forming an encapsulation film 43; (18) forming a light converging lens 13; (19) forming a polarizing layer 44; (20) forming an optical clear adhesive layer 45; (21) forming a contact layer 20.

Figure 7B:
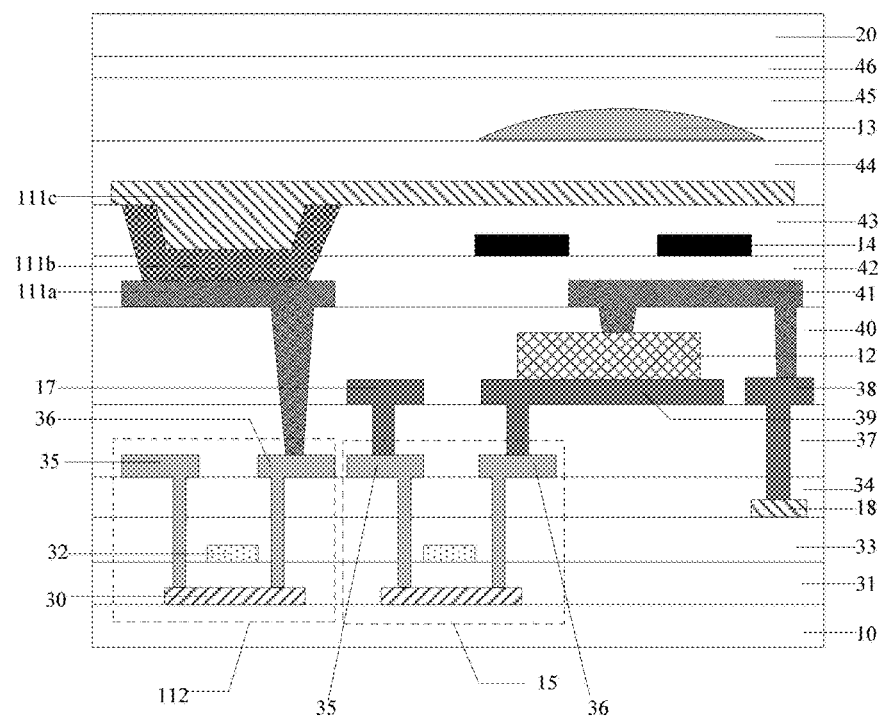

As illustrated in FIG. 7b, the surface texture identification display device provided by the embodiment of the present disclosure includes a base substrate 10; above the base substrate sequentially disposed are: a gate electrode 30; a gate electrode insulation layer 31; an active layer 32; a first dielectric layer 33; a reference signal line 18; a second dielectric layer 34; a source electrode 35 and a drain electrode 36 provided in the same layer; a first insulation layer 37; a identification output line 17, a first connection portion 38 and a second connection portion 39 which are disposed in a same layer; a light sensing unit 12; a second insulation layer 40; a first electrode layer 111a and a third connection portion 41 provided in the same layer; a first pixel defining layer 42; a light shielding component 14; a second pixel defining layer 43; a light-emitting layer 111b; a second electrode layer 111c; an encapsulation film 44; a light converging lens 13; a polarizing layer 45; an optical clear adhesive layer 46 and a contact plate 20 (i.e., a protective cover).

The first electrode layer 111a is an anode layer, the second electrode layer 111c is a cathode layer; the first electrode layer 111a is connected with the drain electrode 36 of the pixel switching transistor 112, and the identification output line 17 is connected with the source electrode 35 of the control switching transistor 15. One end of the light sensing unit 12 is connected with the drain electrode 36 of the control switching transistor 15 via the second connection portion 39. The other end of the light sensing unit 12 is connected with the reference signal line 18 through light shielding component 14, the third connection portion 41 and the first connection portion 38. Herein, the light shielding component 14 is conductive.

For example, the light sensing unit is a photodiode, and the photodiode generally includes a P electrode, a semiconductor layer, and an N electrode.

For example, a transparent conductive layer is further disposed between the photodiode and the third connection portion, which is not limited herein.

Taking the surface texture identification display device illustrated in FIG. 7b as an example, the method for fabricating the surface texture identification display device includes the following steps: (1) forming a gate electrode 30; (2) forming a gate electrode insulation layer 31; (3) forming an active layer 32; (4) forming a first dielectric layer 33; (5) forming a reference signal line 18; (6) forming a second dielectric layer 34; (7) forming a source electrode 35 and a drain electrode 36; (8) forming a first insulation layer 37; (9) forming a identification output line 17, a first connection portion 38 and a second connection portion 39; (10) forming a light sensing unit 12; (11) forming a second insulation layer 40; (12) forming a first electrode layer 111a and a third connection portion 41; (13) forming a first pixel defining layer 42; (14) forming a light shielding component 14; (15) forming a second pixel defining layer 43; (16) forming a light-emitting layer 111b; (17) forming a second electrode layer 111c; (18) forming an encapsulation film 44; (19) forming a light converging lens 13; (20) forming a polarizing layer 45; (21) forming an optical clear adhesive layer 46; (22) forming a contact plate 20.

The above-mentioned surface texture identification display devices provided by the embodiments of the present disclosure includes a base substrate and a contact plate opposite to each other, and light sensing units located on at least partially pixel regions on the base substrate, light converging lenses in a one-to-one correspondence with the light sensing units and located on a side of each of the light sensing units facing the contact plate, and light shielding parts in a one-to-one correspondence with the light converging lenses and located between the light converging lens and a corresponding light sensing unit. Because the light transmission hole and the light converging lens are disposed between each light sensing unit and the contact plate, when a finger or a palm touches the contact plate, the light converging lens is used to enable light reflected by the finger or the palm and irradiating on the light converging lens to be converged toward the main optical axis of the light converging lens. Moreover, due to the light transmission hole is provided, only a part of the light satisfying specific conditions can be irradiated on the light sensing unit, so that each light sensing unit only collects light with a specific transmission direction, thereby reducing optical crosstalk even if a distance between the light sensing unit and the contact plate is large. Moreover, the light converging lens can increase light intensity, so as to improve touch sensitivity.

Obviously, those skilled in the art can make various modifications and variations to the present disclosure without departing from the spirit and scope of the disclosure. In this way, if these modifications and variations of the disclosure fall within the scope of the claims of the disclosure and the equivalent technologies, the disclosure is also intended to include these modifications and variations.

The application claims priority to the Chinese patent application No. 201610633369.5, filed Aug. 4, 2016, the entire disclosure of which is incorporated herein by reference as part of the present application.

The invention claimed is:

1. A surface texture identification display device comprising;
    a base substrate and a contact plate overlapped with each other, the contact plate comprising a first surface configured to contact a textured surface, the first surface being located on a side of the contact plate facing away from the base substrate; and
    a plurality of pixel units located between the base substrate and the contact plate, wherein at least one of the pixel units, comprises:
    a light sensing component on the base substrate;
    a light converging component located between the light sensing component and the contact plate; and
    a light shielding component located between the light converging component and the light sensing component, wherein the light shielding component has a light transmission hole so that light passing through the contact plate and the light converging component passes through the light transmission hole to arrive at the light sensing component,
    wherein a main optical axis of the light converging component is located in a cross section, a center of the light transmission hole and a focal point of the light converging component are located in the cross section and do not coincide with each other, a width d of the light transmission hole in the cross section satisfies: d≥sl/f;

wherein, s refers to a distance between a center of the light transmission hole and a focal point of the light converging component, l refers to a maximum width of the light converging component in the cross section, and f refers to a focal length of the light converging component.

2. The surface texture identification display device according to claim 1, wherein a center of the light transmission hole coincides with a focal point of the light converging component.

3. The surface texture identification display device according to claim 1, wherein the at least one pixel unit further comprises: a first switching element, a source electrode of the first switching element is connected with the light sensing component, a gate electrode of the first switching element is connected with a scanning line, and a drain electrode of the first switching element is connected with a signal line.

4. The surface texture identification display device according to claim 3, wherein the at least one pixel unit further comprises: a second switching element and a light-emitting component; wherein the light-emitting component comprises a first electrode layer, a second electrode layer and a light-emitting layer therebetween, the first electrode layer is connected with the second switching element.

5. The surface texture identification display device according to claim 4, wherein the light sensing component is a photodiode comprising a first electrode and a second electrode, the first electrode is connected with the source electrode of the first switching element, the second electrode is connected with a reference signal line.

6. The surface texture identification display device according to claim 4, wherein,
the light-emitting component is located on a side of the second switching element facing the contact plate;
the light sensing component is located between the second switching element and the second electrode of the light-emitting component.

7. The surface texture identification display device according to claim 4, wherein the light converging component is located between the second electrode layer and the contact plate.

8. The surface texture identification display device according to claim 4, wherein in a direction perpendicular to the base substrate, the second electrode layer is overlapped with the light converging component and the light shielding component.

9. The surface texture identification display device according to claim 4, wherein the light shielding component is located between the first electrode layer and the second electrode layer.

10. The surface texture identification display device according to claim 4, wherein the shielding component and the first electrode layer are located in a same layer.

11. The surface texture identification display device according to claim 4, wherein an orthographic projection of the light shielding component on the base substrate is not overlapped with an orthographic projection of the first electrode layer on the base substrate.

12. The surface texture identification display device according to claim 4, wherein the second electrode layer is configured to transmit light emitted by the light-emitting layer.

13. The surface texture identification display device according to claim 4, wherein the source electrode of the first switching element and a source electrode of the second switching element are located in a same layer, the drain electrode of the first switching element and a drain electrode of the second switching element are located in a same layer; the gate electrode of the first switching element and a gate electrode of the second switching element are located in a same layer; and an active layer of the first switching element and an active layer of the second switching element are located in a same layer.

14. The surface texture identification display device according to claim 1, wherein a main optical axis of the light converging component is substantially perpendicular to the contact plate.

15. The surface texture identification display device according to claim 1, wherein the light converging component is a convex lens.

16. The surface texture identification display device according to claim 1, wherein a shape of an orthographic projection of the light transmission hole on the contact plate is substantially same as a shape of an orthographic projection of the light converging component on the contact plate.

17. The surface texture identification display device according to claim 1, wherein a center of the light transmission hole is located on a main optical axis of the light converging component.

18. A surface texture identification display device comprising:
a base substrate and a contact plate overlapped with each other, the contact plate comprising first surface configured to contact a textured surface, the first surface being located on a side of the contact plate facing away from the base substrate; and
a plurality of pixel units located between the base substrate and the contact plate, wherein at least one of the pixel units comprises:
a light sensing component on the base substrate;
a light converging component locate between the light sensing component and the contact plate; and
a light shielding component located between the light converging component and the light sensing component, wherein the light shielding component has a light transmission hole so that light passing through the contact plate and the light converging component passes through the light transmission hole to arrive at the light sensing component,
wherein the at least one pixel unit further comprises: a first switching element, a source electrode of the first switching element is connected with the light sensing component, a gate electrode of the first switching element is connected with a scanning line, and a drain electrode of the first switching element is connected with a signal line,
wherein the at least one pixel unit further comprises: a second switching element and a light-emitting component: wherein the light-emitting component comprises a first electrode layer, a second electrode layer and a light-emitting layer therebetween, the first electrode layer is connected with the second switching element,
wherein the sensing component is a photodiode comprising a first electrode and a second electrode, the first electrode is connected with the source electrode of the first switching element, the second electrode is connected with a reference signal line, and wherein the light shielding component is conductive, and the second electrode of the light sensing component is connected with the reference signal line through the light shielding component.

* * * * *